United States Patent
Onishi et al.

(10) Patent No.: US 7,442,562 B2
(45) Date of Patent: Oct. 28, 2008

(54) METHOD FOR MANUFACTURING OPTICAL MODULE

(75) Inventors: Masahiro Onishi, HongKong (CN); Heng Wang, HongKong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 302 days.

(21) Appl. No.: 11/476,202

(22) Filed: Jun. 28, 2006

(65) Prior Publication Data

US 2007/0007182 A1    Jan. 11, 2007

(30) Foreign Application Priority Data

Jun. 28, 2005    (JP) ............................. 2005-188310

(51) Int. Cl.
*H01L 21/00*    (2006.01)
(52) U.S. Cl. ........................... 438/22; 438/29; 209/538; 257/E31.127
(58) Field of Classification Search .................... 438/22; 209/538
See application file for complete search history.

(56) References Cited

U.S. PATENT DOCUMENTS 6,642,072 B2 * 11/2003 Inoue et al. .................... 438/26
2002/0030194 A1 * 3/2002 Camras et al. ................. 257/98
2003/0022407 A1 * 1/2003 Sakamoto et al. ............. 438/22

FOREIGN PATENT DOCUMENTS

| JP | 2000-091642 | 3/2000 |
| JP | 2002-090587 | 2/2002 |

* cited by examiner

*Primary Examiner*—Walter L. Lindsay, Jr.
*Assistant Examiner*—Abdulfattah Mustapha
(74) *Attorney, Agent, or Firm*—Nixon & Vanderhye P.C.

(57) ABSTRACT

The invention relates to an optical module manufacturing method for bonding a can portion having an optical semiconductor element and a barrel portion of the optical module together, comprising the steps of: a bonding step for bonding a joint surface of the can portion and a joint surface of the barrel portion by thermoset adhesive, so as to form an interior room defined by the bonded can portion and barrel portion (S1); a receiving step for receiving the bonded can portion and the barrel portion into a hermetical container (S2); a curing step for heating interior of the hermetical container so as to solidify the thermoset adhesive dispensed on the joint surfaces (S3); a cooling step for reducing a temperature inside the hermetical container after the thermoset adhesive is cured (S4); and a step of taking the can portion and the barrel portion out from the hermetical container. The resin on the joint portion of the can portion and the barrel portion can be cured at a high temperature under condition that the can portion and the barrel portion are sealed together.

6 Claims, 5 Drawing Sheets

(a)

(b)

METHOD FOR MANUFACTURING OPTICAL MODULE

FIELD OF THE INVENTION

The invention relates to a method for manufacturing optical module, and more particularly to a method for bonding a can portion and a barrel portion of an optical module having a hermetical structure.

BACKGROUND OF THE INVENTION

Nowadays, optical modules such as transmitter optical sub assembly (TOSA) and receiver optical sub assembly (ROSA) are widely used in information processing which is performed via optical communication or optical signal. Here, the TOSA is a miniature optical device with a light-emitting element (for example a laser diode) carried thereon for transmitting signal, and the ROSA is a miniature optical device having a light-receiving element (such as a photodiode) carried thereon for receiving signal. These optical modules are formed by bonding a can portion and a barrel portion together, the can portion being formed by encasing optical semiconductor elements such as light-emitting element or light-receiving element by a cover e.g. metal cover, the barrel portion being equipped with a lens.

In prior art, the can portion and the barrel portion are aligned with an optical semiconductor element disposed on the can portion and an optical axis of a lens disposed on the barrel portion, and bonded together by adhesive such as thermoset resin, e.g. epoxy resin. However, curing the resin takes a long time of heating; in addition, deterioration of work property and work efficiency, or resin deformation that occurs during curing process, may cause deflection of the optical axis. Resultantly, a method for solving the above problems is proposed, in which bonding is performed instantly using ultraviolet curing adhesive; however, ultraviolet curing adhesive has low adhesion intensity which may cause to form uncured region easily, and ultraviolet curing adhesive has low weather resistance. According to content documented in patent reference 1, a method is disclosed, in which thermoset resin is dispensed in form of spot and then heated to cure by high frequency induction heating, after that another type of thermoset resin is dispensed thereon and cured by heating in air.

In addition, according to content documented in patent reference 2, a method is described in consideration of the problem of higher temperature in local region caused by high frequency induction heating disclosed in patent reference 1. The method comprises a step of dispensing a curing resin, which is capable of receiving ultraviolet radiation and being heated, on a bonding surface of the can portion and the barrel portion, a step of temporary fixation by ultraviolet radiation and a step of reheating and curing the nonbonding region by irradiating ultraviolet after the center portion is aligned.

Patent reference 1: Japanese patent application publication NO. 2000-91642.

Patent reference 2: Japanese patent application publication NO. 2002-90587.

However, conventional technology described above has following problems. Firstly, as for an optical module, it is preferred that the optical module take a hermetic structure to improve reliability of the optical semiconductor element disposed on the can portion, thus preventing contact of the optical semiconductor with atmosphere especially contact with moisture, and avoiding degradation phenomena. However, heating of the resin in a hermetic environment results in thermal inflation of the gas contained in the barrel portion, in addition, as thermal inflation coefficient of the gas is greatly larger than that of material that forms the can portion and the barrel portion, the gas leaks through the bonding resin, and bubbles or fissures are formed in the bonding resin, thus causing problem of degraded sealability. Moreover, in normal case, resin with higher curing temperature presents better adhesion or sealability and can achieve high quality of bonding. However, heating at high temperature makes interior liquid expanding gradually, thus limiting usage of the high temperature resin, and affecting reliable and high quality of bonding. According to content of foregoing patent reference, since through holes are formed on the barrel portion, leakage of inflated gas is uneasy to happen; but these through hole need to be sealed by adhesive after the bonding process, and this further complicates the operation process and increases manufacture cost. Moreover, if these through hole are not sealed, the light-emitting element will be influenced by exterior environment and reliability thereof will be weakened.

When irradiating the curing resin using UV light, gas temperature in the barrel portion may still rise to a high level, thereby causing similar problem of thermal expansion.

When irradiation intensity of UV light is reduced for purpose of thermal expansion restriction, curing time will be prolonged and this will have influence on production in batch. Furthermore, since UV curing adhesive or curing resin for purpose of UV irradiation and heating is expensive, and UV irradiation device is necessary, the manufacture cost is increased greatly.

SUMMARY OF THE INVENTION

Accordingly, one object of the invention is to provide an optical module manufacturing method, which can make the resin dispensed on the joint portion of the can portion and the barrel portion cured at a high temperature in condition that the can portion and the barrel portion are hermetic from outside, thus achieving good operability and high quality of combination.

The invention relates to an optical module manufacturing method for bonding a can portion having an optical semiconductor element and a barrel portion of the optical module together. The method comprises the steps of: a bonding step for bonding a joint surface of the can portion and a joint surface of the barrel portion by thermoset adhesive, so as to form an interior room defined by the bonded can portion and barrel portion; a receiving step for receiving the bonded can portion and the barrel portion into a hermetical container; a curing step for heating interior of the hermetical container so as to solidify the thermoset adhesive dispensed on the joint surfaces; a cooling step for reducing a temperature inside the hermetical container after the thermoset adhesive is cured; and a step of taking the can portion and the barrel portion out from the hermetical container.

According to the invention, the sealed can portion and the barrel portion is contained in the hermetical container, and by heating the hermetical container, temperature therein can be increased. Specifically, the interior room and the hermetical container can be heated with a substantially same temperature rising rate. Consequently, though the interior pressure inside the interior room is increased with the temperature increase therein, the interior pressure of the hermetical container is also increased with the temperature increase; therefore, almost no pressure difference exists between the interior room and the hermetical container, thus the adhesive dispensed on the joint surfaces of the can portion and the barrel portion being unaffected by the pressure difference. Accordingly, even the interior pressure of the interior room is increased; leakage of the gas inside the interior room due to interior pressure increase is still decreased, and possibility of forming bubbles or crack in the thermoset adhesive or sealability deterioration of the joint portion is still decreased. In addition, no means such as forming through holes in the barrel portion for restraining interior pressure is needed, since in the bonding process of the method, a hermetic interior room is defined between the can portion and the barrel portion and the final bonding process is performed under this condition, thus optimizing the operation.

Preferably, the receiving step comprises a step of pressurizing the interior of the hermetical container such that the interior pressure inside the hermetical container except the interior room is higher than that of the interior room.

Moreover, in the receiving step, it is preferred that the interior pressure of the hermetical container is up to 10% higher than that of the interior room.

In addition, the bonding step may be implemented in environment of nitrogen gas.

Preferably, the curing step comprises a step of putting the hermetical container into a heating furnace.

Preferably, the thermoset adhesive may be epoxy resin.

As described above, according to the optical module manufacturing method of the invention, when the interior pressure of the interior room increases with temperature rise, the interior pressure of the hermetical container may also increase with the temperature rise at the same rate; therefore, thermoset adhesive dispensed on the joint surfaces of the can portion and the barrel portion is not affected by pressure difference. In addition, according to the invention, the bonding process may also be implemented under condition that the can portion and the barrel portion are sealed together. Moreover, according to the invention, the resin on the joint portion of the can portion and the barrel portion can be cured at a high temperature under condition that the can portion and the barrel portion are sealed together, thus achieving good operability and high quality of bonding.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
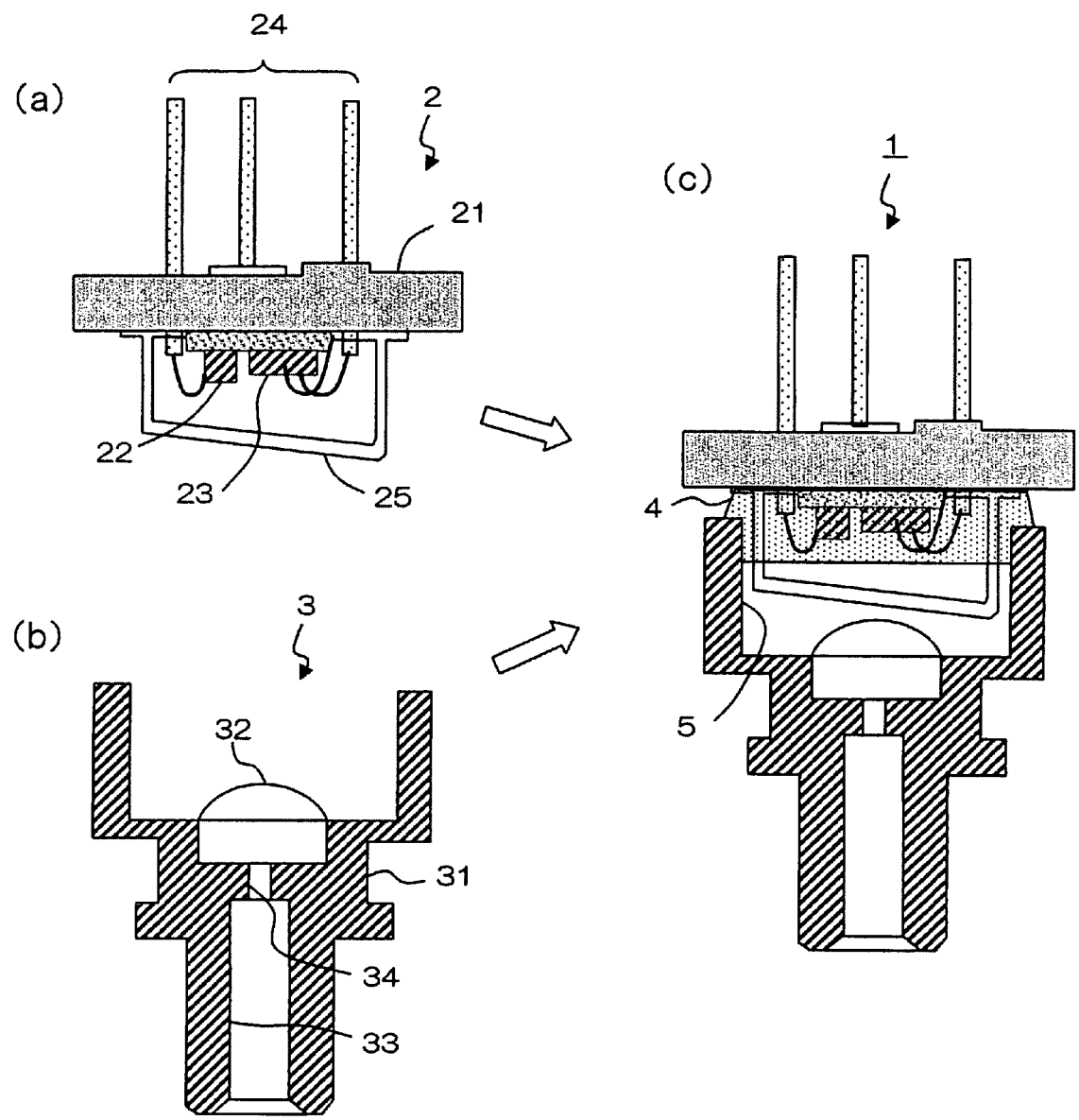
FIG. 1 shows cross-sectional views of a TOSA according to an embodiment of the invention.

Now, a method of manufacturing optical module provided by embodiments of the invention will be described in great detail in conjunction with the drawings. First, a sketch structure of an optical module according to an embodiment of the invention is described. The method of the invention can be applied to both TOSA (transmitter optical sub assembly) and ROSA (receiver optical sub assembly), and a TOSA is taken as an example in the embodiment. FIG. 1 shows a cross-sectional view of a TOSA according to an embodiment of the invention.

FIG. 1(a) shows a cross-sectional view of a can portion having an optical semiconductor element incorporated therein. A light-emitting element 22 and a light-receiving element 23 are disposed on a base end 21 (lower position in the figure) of the can portion 2. Here the light-emitting element 22 may be a laser diode and the light-receiving element 23 may be a photodiode. The light-receiving element 23 is provided for controlling irradiation intensity when the light-emitting element 22 is in use. Several terminals 24, which control operation of the light-emitting element 22 and the light-receiving element 23, extend from an opposite side of the base end 21. In addition, a metallic cover 25 may be disposed on the base end 21 for encasing the light-emitting element 22 and the light-receiving element 23. A semi-transparent mirror or lens (not shown) for ensuring optical path may be disposed adjacent central portion of the cover 25. The base end 21 and the cover 25 are combined each other by resistance welding.

FIG. 1(b) shows a cross-sectional view of a barrel portion. The barrel portion 3 comprises an enclosure 31 that forms main portion of the barrel portion, and a lens 32 supported on the enclosure 31. The enclosure 31 has an opening 33 formed on its front end. A ferrule (not shown) for holding an optical fiber is embedded in the opening 33. The ferrule may also be formed integrally with the opening 33. The opening 33 has an optical aperture 34 formed at an inner side of the opening 33 and a lens 32 is positioned at front end of the optical aperture 34. Optical coupling between the light-emitting element 22 and the fiber held by the ferrule is realized through the lens 32 and the optical aperture 34. For achieving an optical coupling with higher precision, a higher aligning precision is required for mounting the lens 32, also, a non-directional spherical lens may be used herein.

FIG. 1(c) shows a cross-sectional view of an optical module. The optical module 1 is constructed by combining the can portion 2 and the barrel portion 3 together using an adhesive 4. The adhesive 4 is of thermoset adhesive, and epoxy resin may be utilized herein. An interior room 5 is defined between the can portion 2 and the barrel portion 3. The optical module 1 has a hermetic structure and the interior room 5 thereof is hermetic. Namely, no openings or through holes, through which the interior room 5 is communicated with external atmosphere, are formed in the can portion 2 or barrel portion 3. Thus, crack of the light-emitting element 22 or light-receiving element 23 located in the interior room 5 caused by contact with atmosphere, especially with moisture is prevented.

Figure 2:
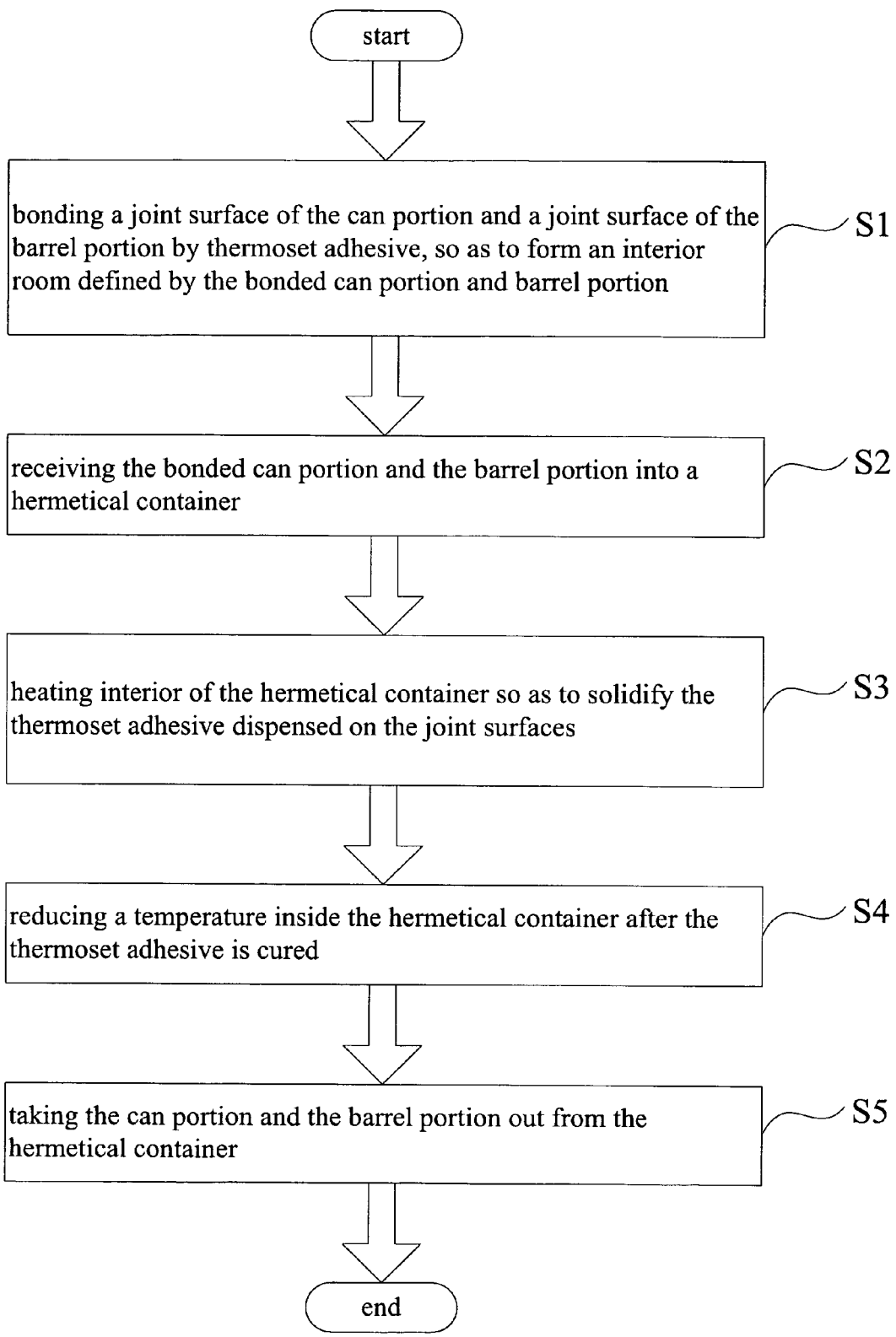
FIG. 2 shows a flowchart illustrating a method for manufacturing optical module according to an embodiment of the invention.

Next, a method of manufacturing the optical module is illustrated with reference to the drawings. FIG. 2 shows a flowchart illustrating a method for manufacturing the optical module according to an embodiment of the invention.

Figure 3:
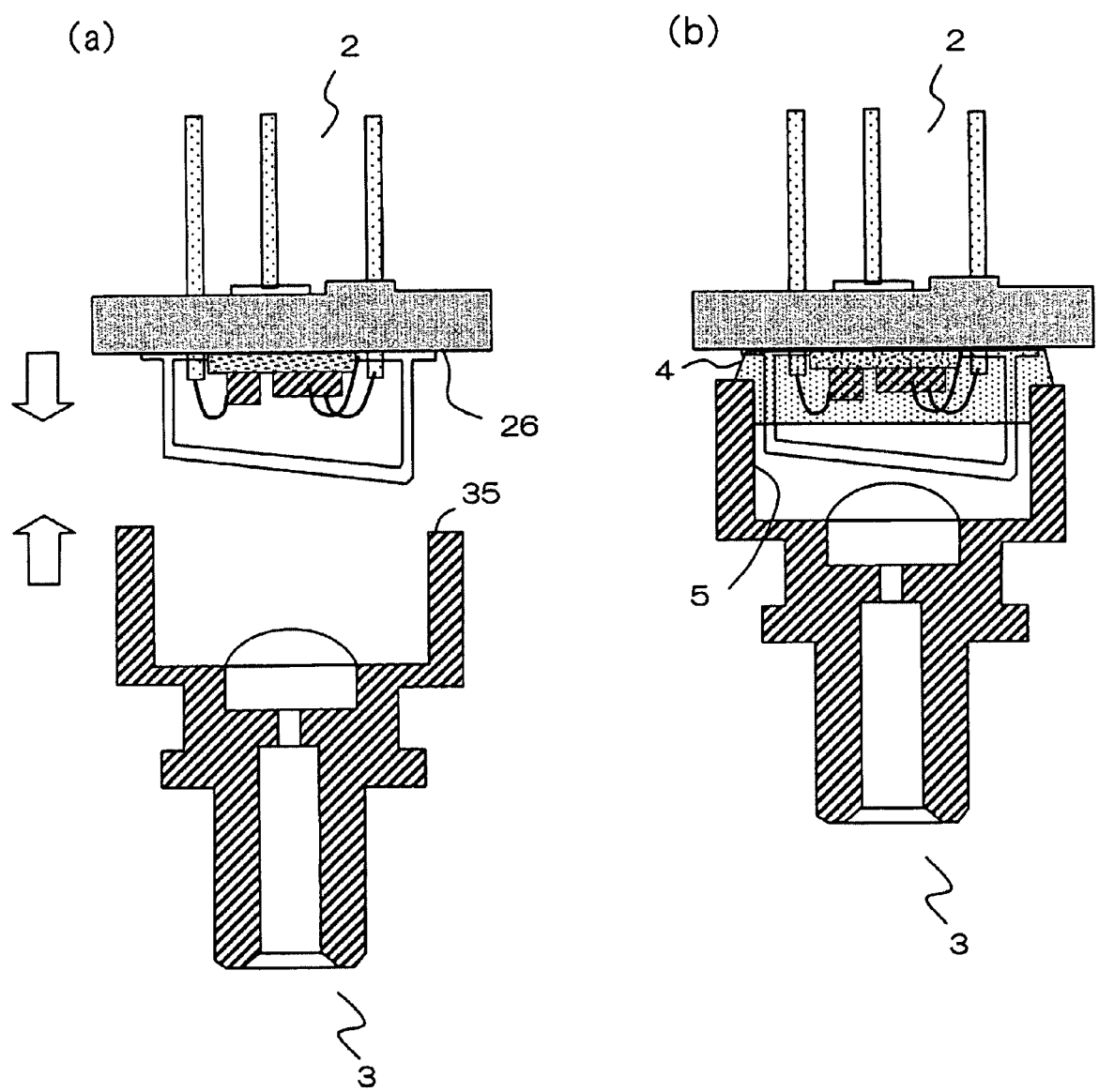
FIG. 3 shows cross-sectional views illustrating a step of bonding a can portion with a barrel portion together.

(Step 1) Firstly, the can portion 2 and the barrel portion 3 are manufactured respectively; then, as shown in FIG. 3(a), a joint surface 26 of the can portion 2 and a joint surface 35 of the barrel portion 3 are placed approaching and toward each other. Then, as shown in FIG. 3(b), a thermoset resin adhesive 4 is filled in space defined between the joint surfaces 26 and 35. Thus a hermetical interior room 5 is formed between the can portion 2 and the barrel portion 3. Specifically, the joint surface 26 of the can portion 2 and the joint surface 35 of the barrel portion 3 are hermetically bonded together by the thermoset adhesive 4, and the hermetical interior room 5 is formed between the can portion 2 and the barrel portion 3. The step is performed at normal temperature and pressure, and the hermetical interior room 5 has the same pressure as external atmosphere. As for bonding method, the adhesive 4 may also be dispensed on either or both of the joint surface 26 of the can portion 2 and the joint surface 35 of the barrel portion 3 in advance, and then the joint surfaces 26 and 35 are bonded together.

In addition, the step is preferably implemented in environment of nitrogen gas. Based on the consideration, after the can portion 2 and the barrel portion 3 are combined hermetically by the adhesive 4 dispensed therebetween, the interior room 5 is filled with the nitrogen gas, and accordingly crack of the light-emitting element 22, light-receiving element 23 or adhesive 4 caused by oxygen gas or moisture in atmosphere is avoided.

Figure 4:
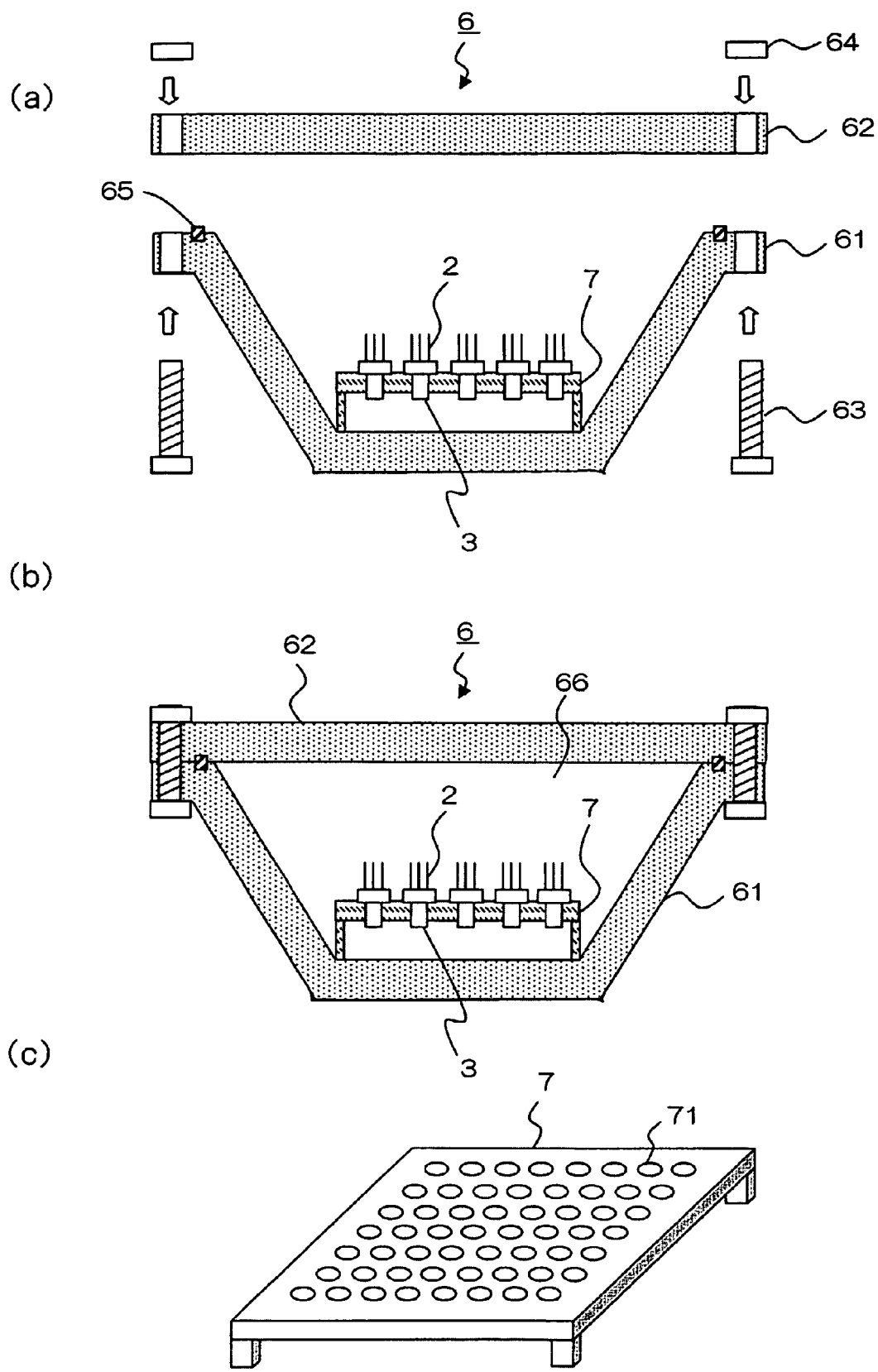
FIG. 4 shows views of a hermetical container.

(Step 2) The combined can portion 2 and barrel portion 3 is contained in a hermetical container 6. FIG. 4 shows a schematic view of the hermetical container. As illustrated in the cross-sectional view of FIG. 4(a), the hermetical container 6 is comprised of a receiving body 61 and a lid 62, and the receiving body 61 is capable of accommodating aggregation of the can portion 2 and the barrel portion 3 that are supported by a support plate 7. Several screw holes are formed on outer fringe portion of the receiving body 61 and circumference of the lid 62. The lid 62 can be opened or closed by engagement of the screw holes 63 and nuts 64. As shown in FIG. 4(b), a seal member 65 is formed on the outer fringe portion, and when the lid 62 is covered thereon, a sealed space 66 is defined interiorly.

As shown in FIG. 4(c), the support plate 7 is a flat part having a plurality of retention holes 71 formed thereon. Each retention hole 71 supports an aggregation of the can portion 2 and the barrel portion 3, and several optical module-bonding processes can be performed at a time.

When in receiving process, the sealed space 66 of the hermetical container 6 can be pressurized such that pressure inside the hermetical container 6 (except for the interior room 5) rises and becomes higher than that of the interior room 5. Accordingly, although sealability of the can portion 2 and the barrel portion 3 can be improved, overwhelming interior pressure difference results in deformation of the adhesive 4, thus leading to deflection of the optical axis. Preferably, interior pressure of the hermetical container 6 may be up to 10% higher than that of the interior room 5.

Figure 5:
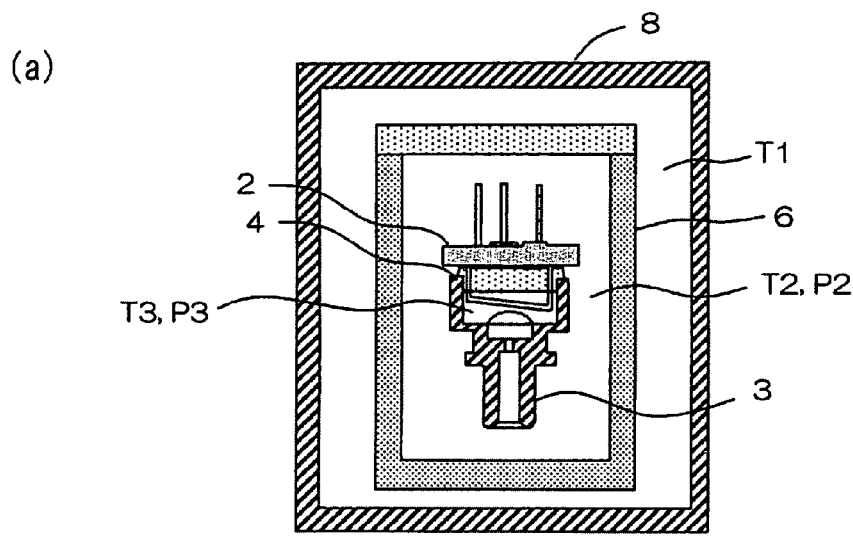
FIG. 5 shows views of partition structure and temperature distribution inside an oven.
Figure 5:
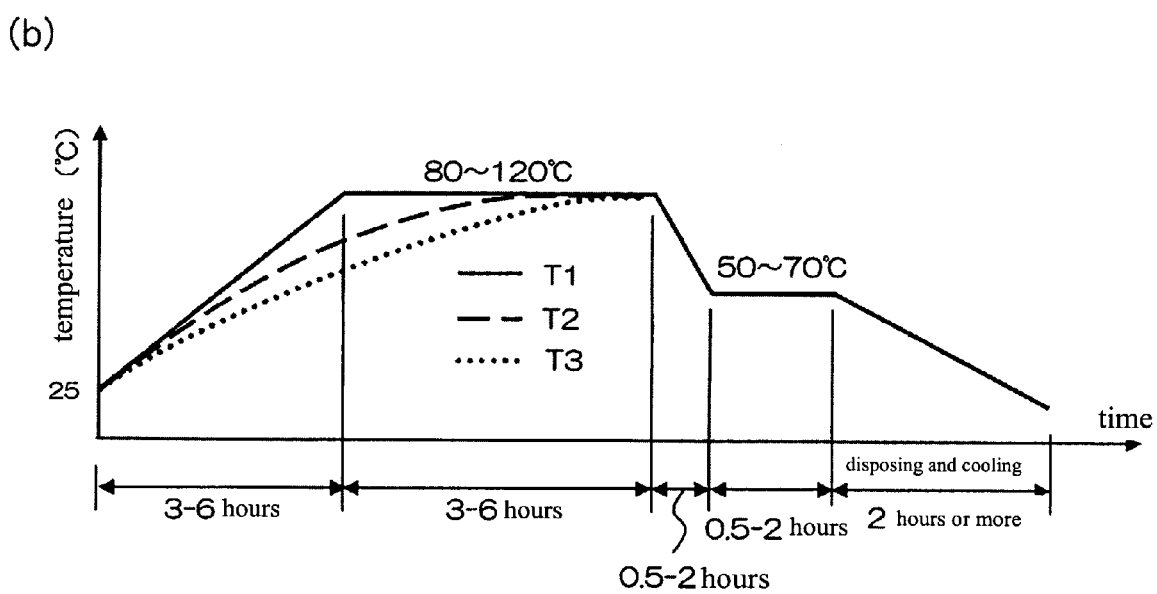

(Step 3) The hermetical container 6 is put into a heating furnace 8, for example an oven, and interior of the heating furnace 8 is heated. FIG. 5 shows structure and temperature distribution inside the heating furnace. As illustrated in FIG. 5(a), each hermetical container 6 with certain number of aggregations comprised of the can portion 2 and the barrel portion 3 contained therein can be heated (only an aggregation is shown). Temperature T1 inside the heating furnace 8 rises according to temperature distribution trend shown in FIG. 5(b). Due to reasons such as the hermetical container 6 or thermal capacity of the interior gas, temperature T2 inside the hermetical container 6 rises more slowly than temperature T1. Due to the same reason, temperature T3 inside the interior room 5 rises even much more slowly than temperature T2, yet temperature T3 can reach its curing temperature finally and cure the adhesive 4 dispensed on the joint surfaces 26, 35. Moreover, since difference between temperature T2 and T3 is very small, the interior pressure P2 inside the hermetical container 6 and the interior pressure P3 inside the interior room 5 are almost kept unchanged. Therefore, the adhesive 4 is almost uninfluenced by difference between the interior pressure P2 and interior pressure P3, and the gas (nitrogen gas) inside the interior room 5 will not leak from the adhesive 4 and will not influence sealability after the adhesive 4 is cured.

(Step 4) After the adhesive 4 is cured, temperature in the hermetical container 6 is decreased to normal temperature in accordance with temperature trend shown in FIG. 5(b). In the temperature decreasing process, almost no difference between temperature T2 and T3 occurs, and the adhesive 4 almost bears no influence resulted from the difference between the interior pressure P2 and P3. Therefore, the can portion 2 and the barrel portion 3 can be combined together by the above steps.

(Step 5) Finally, the hermetical container 6 is taken out from the heating furnace 8, and in turn, the combination of can portion 2 and barrel portion 3 is taken out from the hermetical container 6.

Summarily, according to the optical module manufacturing method of embodiments of the invention, since almost no pressure difference applies to the thermoset adhesive dispensed on the joint surface(s) of the can portion and the barrel portion, bubbling or cracking problems will not occur in the adhesive, thus improving reliability of the joint portion. Furthermore, the above problems will not happen even in environment of high temperature; therefore, adhesive that cures at high temperature can be utilized, thus further improving stability of the joint portion. Moreover, according to the invention, the combination process can be performed in case where the can portion and the barrel portion are hermetic from outside, and therefore a step of forming through holes in the barrel portion and then stuffing the through holes after completion of the whole work is omitted, thereby improving production efficiency and operability greatly. In addition, device such as oven used by prior art can be taken as the heating furnace of the invention, and only new hermetical container is needed, thus reducing manufacturing cost.

What is claimed is:

1. A manufacturing method of optical module, which is a method for bonding a can portion having an optical semiconductor element and a barrel portion of the optical module together, comprising the steps of:
    a bonding step for bonding a joint surface of the can portion and a joint surface of the barrel portion by thermoset adhesive, so as to form an interior room defined by the bonded can portion and barrel portion;
    a receiving step for receiving the bonded can portion and the barrel portion into a hermetical container;
    a curing step for heating interior of the hermetical container so as to solidify the thermoset adhesive dispensed on the joint surfaces;
    a cooling step for reducing a temperature inside the hermetical container after the thermoset adhesive is cured; and
    a step of taking the can portion and the barrel portion out from the hermetical container.

2. The manufacturing method according to claim 1, wherein the receiving step comprises a step of pressurizing the interior of the hermetical container such that an interior pressure inside the hermetical container except the interior room is higher than that of the interior room.

3. The manufacturing method according to claim 2, wherein the interior pressure of the hermetical container is up to 10% higher than that of the interior room.

4. The manufacturing method according to claim 1, wherein the bonding step is implemented in environment of nitrogen gas.

5. The manufacturing method according to claim 1, wherein the curing step comprises a step of putting the hermetical container into a heating furnace.

6. The manufacturing method according to claim 1, wherein the thermoset adhesive is epoxy.

* * * * *